Jan. 9, 1962 W. N. CARROLL 3,016,467

EMITTER FOLLOWER PULSE AMPLIFIER

Filed Dec. 31, 1957

INVENTOR.
WILLIAM N. CARROLL

BY Joseph J. Connerton

ATTORNEY

United States Patent Office 3,016,467

Patented Jan. 9, 1962

3,016,467

EMITTER FOLLOWER PULSE AMPLIFIER

William N. Carroll, Wappingers Falls, N.Y., assignor to International Business Machines Corporation, New York, N.Y., a corporation of New York Filed Dec. 31, 1957, Ser. No. 706,368
7 Claims. (Cl. 307—88.5)

The present invention relates to a switching circuit and more particularly to switching circuits utilizing emitter followers.

An emitter follower is a current amplifier which is used extensively in computer circuitry for inter-stage power amplification. Such circuits exhibit extremely rapid response characteristics and are particularly adaptable to high speed computer applications. In logic circuits using D.C. mode of operation, such circuits have a current gain of beta + 1, where beta is the ratio of emitter current to base current, and a voltage gain slightly less than unity. Due to this latter characteristic, the use of these circuits has heretofore been limited, particularly in applications where a number of successive stages of such circuits are utilized for pulse propagation. Such circuits of the prior art required intermediate voltage amplifiers or level setters, particularly where the signal levels used were such that the losses of individual stages were appreciable with respect to the input signal level.

Emitter follower circuits as utilized in the prior art are generally employed in D.C. level logical circuits as contrasted to pulse logic. In such circuits, emitter current flows at either input signal level, the transistor is never cut off nor is it driven into saturation. Such circuits exhibit transient overshoot effects on the output signal when the input signal is rapidly switched from one level to another. In D.C. type circuitry, these overshoots are undesirable sources of noise, and considerable attention has been directed toward eliminating or reducing these overshoots to a minimum.

As fully described hereinafter, the present invention utilizes this overshoot characteristic to advantage in pulse circuit applications such that both voltage and current amplification of pulse signals are obtained. The present invention utilizes a pulse having a duration less than the regulated overshoot of the emitter follower to obtain the aforecited advantages of emitter followers while simultaneously obtaining a voltage amplification greater than unity, thereby eliminating the necessity for amplification stages. While these circuits have various applications in computer logical circuits, the invention is illustrated in the form of a gate circuit which may be used alone or in stages of a carry ripple adder for propagation of a count pulse.

Accordingly, a primary object of the present invention is to provide an improved high speed switching circuit.

Still another object of the present invention is to provide an improved logical gate circuit.

Another and still further object of the present invention is to provide a circuit having impedance matching and rapid switching characteristics while still providing voltage amplification of pulse signals.

Other objects of the invention will be pointed out in the following description and claims and illustrated in the accompanying drawings, which disclose, by way of example, the principle of the invention and the best mode, which has been contemplated, of applying that principle.

As is well known in the art, an emitter follower is a current driver used for interstage power amplification, and has a voltage gain slightly less than unity. The two general types of emitter followers, NPN and PNP, are essentially complements of each other. The NPN emitter followers are used for current amplification of positive transition signals because capacitive loads or distributed line capacity can be quickly charged to the upper signal level through the low impedance of the heavily conducting transistor PNP emitter followers are used for current amplification of negative transition signals, because distributed line capacity can charge to the lower signal level through the low impedance of the heavily conducting transistor. Both circuits develop transient overshoot effects when the input signal is quickly switched from one level to another. If a positive transition signal is applied to the base of an NPN emitter follower, an overshoot on the leading edge of an output signal is developed when the transistor goes into conduction; if a negative going signal is applied to the base of a PNP emitter follower, an overshoot on the leading edge of an output signal is developed when current is increased in the transistor. This is a function of the turn on time of the emitter base diode. While the present invention will be described with reference to a PNP emitter follower utilizing a negative transition signal, it will be understood that it is equally applicable to an NPN emitter follower and a positive transition signal.

Figure 1:
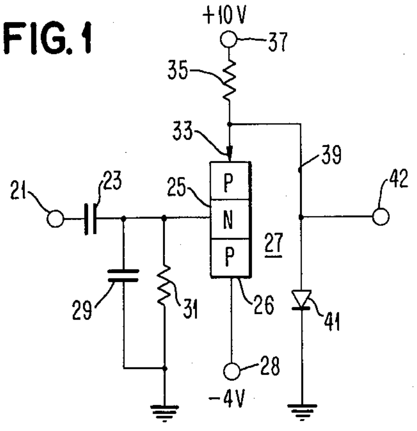
FIG. 1 illustrates in schematic form an emitter follower circuit embracing the subject invention.

Referring now to the drawings and more particularly to FIG. 1 thereof, there is illustrated in schematic form an emitter follower circuit utilizing a PNP junction transistor. Input terminal 21 is connected through capacitor 23 to the base 25 of transistor 27. Capacitor 23 is utilized to compensate for level shift, an inherent characteristic of emitter follower circuits. An RC network comprising capacitor 29 and resistor 31 is connected between the base 25 of transistor 27 and ground. Resistor 31 biases the base of transistor 27 at ground level, while capacitor 29 peaks up transistor 27 to obtain the desired degree of overshoot and to a limited degree controls the negative overshoot characteristics of transistor 27. Collector 26 of transistor 27 is connected to a source of negative potential shown at terminal 28. Emitter 33 of transistor 27 is connected through emitter load resistor 35 to a positive source of potential shown as terminal 37, and also connected through conductor 39 and diode 41 to a source of ground potential. Diode 41 prevents any positive overshoots and ringing. Output terminal 42 is connected directly to the emitter 33.

Figure 2:
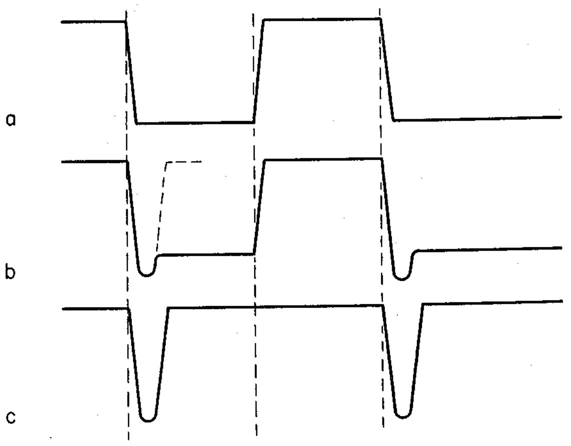
FIG. 2 is a family of curves identifying the waveform at various points throughout the circuit of FIG. 1.

The emitter follower circuit shown in FIG. 1 operates in the following manner. Assuming a negative D.C. level shift of the type shown in FIG. 2*a* is applied to the base 25 of transistor 27, the resulting increase of emitter current will produce an output signal as shown in FIG. 2*b*. Due to the lag in collector-emitter turn-on time, a transient condition exists whereby alpha (current gain) of the transistor becomes greater than unity and a negative overshoot is generated in the output signal, as shown in FIG. 2*b*. The magnitude of the signal shown in FIG 2*b* exceeds that of the signal in FIG. 2*a* for the duration of the overshoot, while the voltage gain for the remainder of the signal is less than unity. The present invention takes advantage of this overshoot characteristic by controlling the duration of the overshoot such that it exceeds that of the pulse applied to the base of transistor 27, thereby obtaining the aforecited advantages of emitter follower circuits while simultaneously obtaining a voltage gain greater than unity. The resulting signal at the emitter will have substantially the same waveform but a higher potential than the input signal.

While a single stage of this device is shown in FIG. 1, a model utilizing several successive stages of the device shown in FIG. 1 was constructed to verify the operation of the present invention. A voltage gain of approximately 1.6 for eight stages was observed, while the delay time required to propagate a signal through these stages was extremely small. In the model constructed, delays of less than 5 millimicroseconds per stage were obtained utilizing surface barrier transistors. The pulse signals employed were approximately 40 millimicroseconds in duration, varied between zero and −3 volts, and the circuit operated at a speed of 10 megacycles.

While the circuit in FIG. 1 utilized a PNP transistor, the circuit is equally applicable to an NPN transistor using a positive signal by changing the collector and bias potentials from the equivalent PNP circuit and reversing the polarity of diode 41. Using a positive signal varying between −3 volts and ground, the +10 volt source is changed to −13 volts, the −4 volt source is changed to +1 volt, and the ground potential is changed to −3 volts. These modifications follow from the fact that PNP and NPN transistors are essentially complements of one another, and generally a circuit designed for one can be used with the other merely by changing the supply potentials as above pointed out. The particular circuit selected would be dictated primarily by the type logic i.e., positive or negative utilized.

Figure 3:
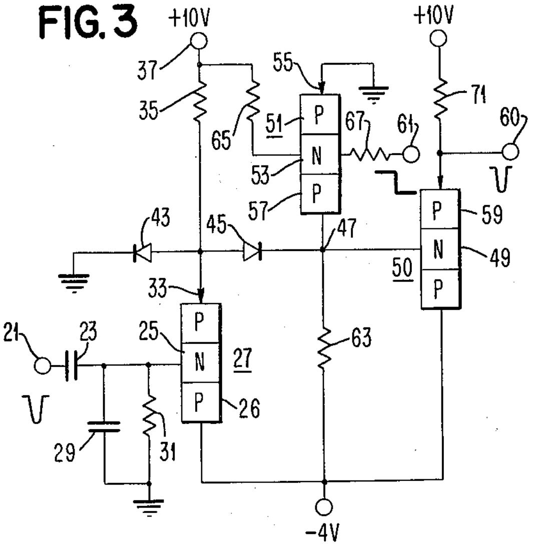
FIG. 3 illustrates in a schematic form a gate circuit incorporating the principles of the present invention.

Referring now to FIG. 3, there is illustrated in schematic form a gate circuit incorporating the principles of the present invention. As is well known in the art, a gate circuit is a circuit which passes a signal only in the presence of an appropriate conditioning or "gating" signal. In the disclosed arrangement, a positive gating signal is used to condition the circuit to pass a negative pulse. The gate circuit illustrated in FIGURE 3 employs three transistor circuits, two coupled emitter follower circuits and an inverter circuit to control the coupling between the emitter follower stages. The first emitter follower stage is substantially identical to that shown in FIG. 1 and is numbered accordingly, but in addition utilizes a diode 43 to clip the upper level of the output signal at emitter 33 at ground level and to eliminate ringing. Emitter 33 is connected through diode 45 and junction 47 to the base 49 of emitter follower circuit 50. The inverter circuit employed in the present arrangement comprises transistor 51 having a base 53, an emitter 55 and a collector 57. As fully described hereinafter, the inverter circuit functions to control the bias on diode 45 in response to the signal on base 53 and thereby control the coupling of the signal between emitter follower stages 27 and 50. The gate circuit of FIG. 3 provides a negative pulse on output terminal 60 if a positive D.C. level is present on input terminal 61 of inverter circuit 51 and a negative pulse is applied to input terminal 21 of emitter follower 27. If a negative level is present on input terminal 61, transistor 51 is On, diode 45 is back biased by the output from collector 57 and the input pulse applied to the first emitter follower stage will be inhibited by coupling diode 45.

The gate circuit arrangement of FIG. 3 operates in the following manner. To condition the gate circuit, a positive D.C. level is applied through terminal 61 and resistor 67 to the base 53 of transistor 51, thereby turning transistor 51 Off. With transistor 51 Off, terminal 47, which is electrically common to collector 57 of transistor 51 and the cathode of diode 45, is maintained at ground potential by the voltage divider network comprising resistors 35, 63 and diode 45 connected between positive and negative power supplies designated as terminals 37 and 65 respectively. Assuming that a negative signal is now applied to the base 25 of transistor 27, the resulting negative signal at emitter 33 will cause the anode of diode 45 to fall, and the cathode of diode 45 will follow, thereby permitting this signal to be coupled to the base 49 of transistor 50. Emitter follower circuit 50 functions as emitter follower 27 so that negative signals applied to base 49 will result in suitably amplified negative signals being applied from emitter 59 to output terminal 60. To decondition or inhibit the gate circuit, a negative signal is applied to the base 53 of transistor 51, the transistor is turned On and the resulting current flow through the transistor clamps the collector 57 at ground potential. Since the cathode of diode 45 is connected through terminal 47 to the collector, it is clamped at ground potential. Under this condition diode 45 is back biased, and any negative variation at the anode of the diode will have no effect on the cathode of the diode. Thus diode 45 effectively inhibits the coupling between the emitter of transistor 27 and the base of transistor 50 when transistor 51 is conducting. From the above description, it will be apparent that diode 45 controls the signal applied from the emitter of transistor 27 to the base of transistor 50, and it is in turn controlled by the conduction state of transistor 51 as above described. Resistor 65 connected between 10 volt terminal 37 and base 53 of transistor 51 is a temperature compensating resistor for transistor 51, while resistor 71 is the resistor associated with emitter 59 of transistor 50.

The above described gate circuit may be modified to use NPN transistors in the manner heretofore described with reference to FIG. 1 whereby a negative D.C. level will condition the gate circuit to pas a positive pulse.

Component values utilized in the preferred embodiment of FIG. 3 are tabulated below to illustrate one operative arrangement of the present invention.

| | |
|---|---|
| Capacitor 23 | μfarad .1 |
| Resistor 31 | 510Ω |
| Resistor 35 | 3K |
| Resistor 65 | 100K |
| Resistor 71 | 3K |

In addition to the tabulated values, the value of capacitor 29 will be determined by the frequency response of the transistor employed and by the amount of overshoot desired. Resistor 67 will be determined by the amount of current required to turn on the transistor for the voltage signal employed.

The above described gate circuit may be used alone, or is particularly applicable as one element or stage in a high speed carry ripple adder. In such an application, a pulse can be rippled through the stages in the adder at a high rate of speed and without attenuation.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A gated pulse amplifier circuit for providing current and voltage amplification of a first signal under control of a second signal comprising first and second semiconductor signal translating devices connected in emitter follower circuit configuration, each transistor having base, collector and emitter electrodes and providing current and voltage amplification of pulse signals applied to the base thereof, capacitive means connected between said base and said collector electrodes for supplementing the capacitance between said base and said collector electrodes to control the duration of the overshoot of said emitter follower circuits, coupling means connecting the emitter terminal of said first transistor to the base terminal of said second transistor, means for applying said first signal to the base of said first emitter follower circuit and means responsive to said second signal for controlling said coupling means to selectively pass or inhibit the resultant signal at the emitter of said first emitter follower stage.

2. A circuit for selectively combining two input signals of predetermined characteristics to provide an output signal only when said input signals possess said predetermined characteristics comprising a plurality of emitter follower stages, each stage including a transistor having base, collector and emitter electrodes, each emitter follower electrode stage producing a transient overshoot at the emitter electrode in response to one of said input signals applied to the base electrode thereof, capacitive means connected between said base and said collector electrodes for supplementing the capacitance between said base and said collector electrodes to control the duration of said overshoot for a period corresponding to that of said input signal, an asymmetric conducting device interconnecting the emitter of each stage to the base of the succeeding stage and an inverter circuit including a third transistor for controlling the bias on said asymmetric conducting device in response to said other input signal whereby an output signal is provided only when said first and second signals occur in substantial time coincidence.

3. In a device for propagating a pulse through a succession of switching circuits at a high rate of speed while amplifying said pulse, the sub-combination comprising a plurality of emitter follower stages, each of said emitter follower stages having transient overshoot characteristics which provide voltage and current amplification of short duration signals applied thereto, each of said emitter follower stages including a transistor having base, collector and emitter electrodes, capacitive means connected between said base and said collector electrodes for supplementing the capacitance between said base and said collector electrodes to control the duration of said overshoot of each of said emiter follower stages for a period corresponding to that of the input signals applied thereto, the emitter electrode of each stage connected to the base electrode of the succeeding stage, output means associated with the emitter of the final stage and means for initiating said propagation by applying said input signal to the base of the first of said emitter follower stages, the resuling output signal being applied from the emitter of each stage to the base of the succeeding stage whereby the resultant signal generated at said output means is current and voltage amplified with respect to said input signal.

4. A gating pulse amplifier for selectively passing applied triggering pulses in response to one voltage level of a two level electrical control signal comprising in combination first, second and third transistors, each of said transistors having base, collector and emitter terminals, an asymmetric impedance device, said first and second transistors being connected in emitter follower configurations, the emitter terminal of said first transistor being connected to the base terminal of said second transistor through said asymmetric impedance device, an inverter circuit including said third transistor, an input circuit for applying said control signal to the base of said third transistor, a voltage divider network including said asymmetric impedance device, the collector of said third transistor being connected to a point on said voltage divider network and deriving its bias therefrom during non-conduction of said third transistor, said collector of said third transistor being also connected to one element of said asymmetric impedance device and controlling the bias thereof during conduction of said transistor whereby signals generated at the emitter of said first transistor in response to said triggering pulse are inhibited by said asymmetric impedance device.

5. An electronic circuit comprising in combination an amplifier having an input and output circuit and operative to produce an output signal varying instantaneously as a function of and substantially in phase with input signals applied thereto, said amplifier circuit including a semiconductor signal translating device having base, emitter and collector electrodes and connected in emitter follower circuit configuration, said circuit exhibiting overshoot characteristics in said emitter circuit in response to certain preselected input signals, means for applying a signal to said base electrode and capacitance means connected between said base and said collector electrodes for supplementing the capacitance between said base and said collector electrodes to control the duration of said overshoot for a period corresponding to that of said input signals.

6. A gating circuit for selectively passing applied pulses in response to one voltage level of a two-level electrical control signal comprising in combination first and second transistors connected in emitter follower circuit configuration, each of said transistors including base, collector and emitter electrodes, means for applying said pulses to the base terminal of said first transistor, output means connected to the emitter terminal of said second transistor, coupling means connecting the emitter of said first transistor to the base of said second transistor, said coupling means comprising an asymmetric impedance device wherein the bias on said device is controlled by said control signal, capacitive means connected between said base and said collector electrodes to supplement the capacitance between said electrodes to thereby control the duration of the overshoot of said emitter follower circuits, and means responsive to said asymmetric impedance device for selectively actuating said coupling means to permit current and voltage amplification of said pulse during the overshoot interval of said emitter follower circuits.

7. An apparatus of the character claimed in claim 6 wherein said coupling means further comprises a third transistor, the collector of said transistor being connected to said asymmetric impedance device and determining the bias thereof, said control signal being applied to the base of said third transistor.

References Cited in the file of this patent

UNITED STATES PATENTS

| | | |
|---|---|---|
| 2,443,195 | Penser | June 15, 1948 |
| 2,740,888 | Zukin | Apr. 3, 1956 |
| 2,787,707 | Cockburn | Apr. 2, 1957 |
| 2,798,153 | Dougherty | July 2, 1957 |
| 2,892,101 | Bright | June 23, 1959 |

OTHER REFERENCES

Sulzer: "Junction Transistor," Electronics, pages 170–173, August 1953.

Handbook of Semiconductor Electronics, by Hunter, 1st ed., Oct. 15, 1956, published by McGraw-Hill Book Co. Inc.; five pages 15–34, 15–35, 15–36, 15–37, 15–38.

Nambier et al.: "Junction-Transistors Bootstrap Linear-Sweep Circuits," Proceedings of the I.E.E., pages 293–305, vol. 10, part B, No. 15, January 1957.